United States Patent [19]

Matsuoka et al.

[11] Patent Number: 5,078,626
[45] Date of Patent: Jan. 7, 1992

[54] CONNECTOR FOR ELECTRIC PARTS

[75] Inventors: Noriyuki Matsuoka; Kazumi Uratsuji, both of Tokyo, Japan

[73] Assignee: Yamaichi Electric Mfg. Co., Ltd., Tokyo, Japan

[21] Appl. No.: 613,984

[22] Filed: Nov. 14, 1990

[30] Foreign Application Priority Data

Nov. 14, 1989 [JP] Japan .................................. 1-295438

[51] Int. Cl.⁵ .................................................. H01R 13/46
[52] U.S. Cl. ...................................... 439/892; 439/71; 439/140
[58] Field of Search ...................... 439/70, 71, 72, 73, 439/68, 140, 141, 374, 892, 893

[56] References Cited

U.S. PATENT DOCUMENTS

| 4,060,296 | 11/1977 | Kunkle et al. | 439/70 |
| 4,490,001 | 12/1984 | Gordon et al. | 439/68 |
| 4,633,239 | 12/1986 | Nalbanti | 439/72 X |
| 4,739,257 | 4/1988 | Jenson et al. | 439/71 X |

FOREIGN PATENT DOCUMENTS

WO89/01248 2/1989 PCT Int'l Appl.

Primary Examiner—Neil Abrams
Assistant Examiner—Khiem Nguyen
Attorney, Agent, or Firm—Wenderoth, Lind & Ponack

[57] ABSTRACT

A connector for an electric part has a plurality of contacts for connecting with an electric part. Leg portions of the contacts are arranged in such a manner as to project from a connector board. The connector also has a locator provided with a plurality of positioning holes formed in a surface of the connector board from which the leg portions of the contacts project. The positioning holes are adapted to permit the leg portions to extend individually through the connector board. The locator can be moved between a first position close to the connector board and a second position spaced apart from the connector board. The connector further includes temporary fixing means for temporarily fixing the locator in the second position spaced apart from the connector board.

10 Claims, 7 Drawing Sheets

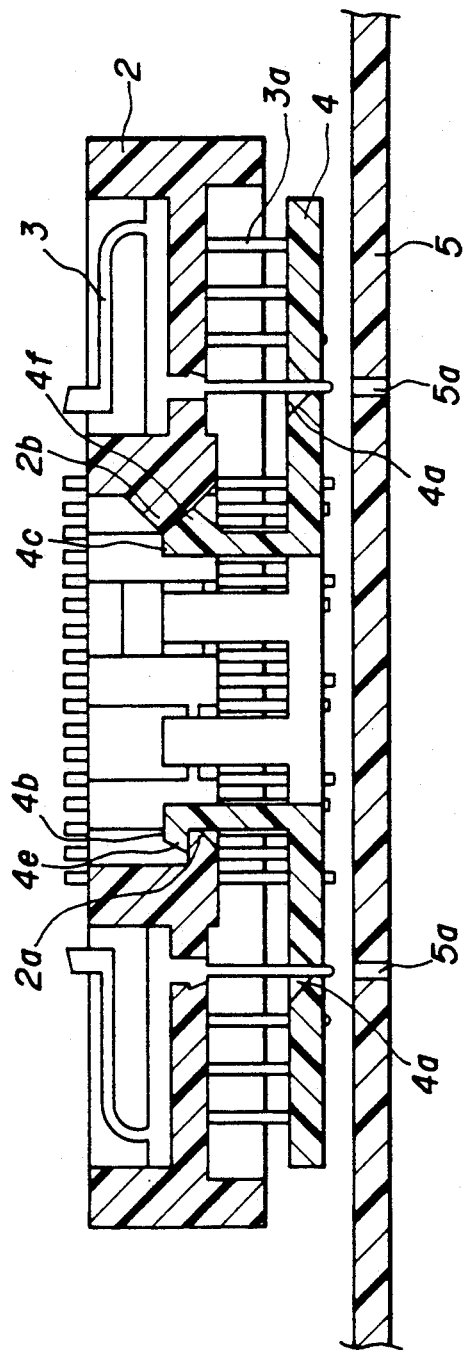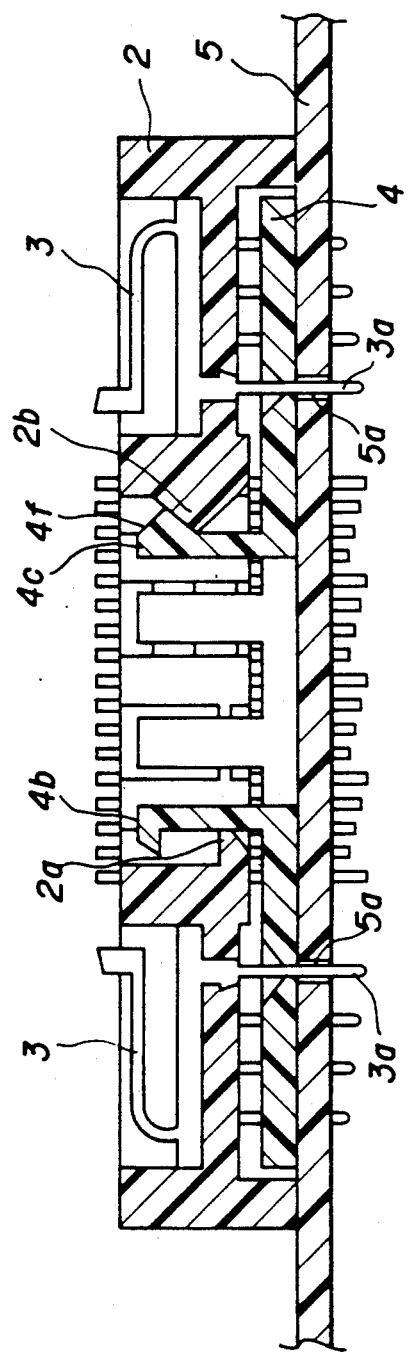

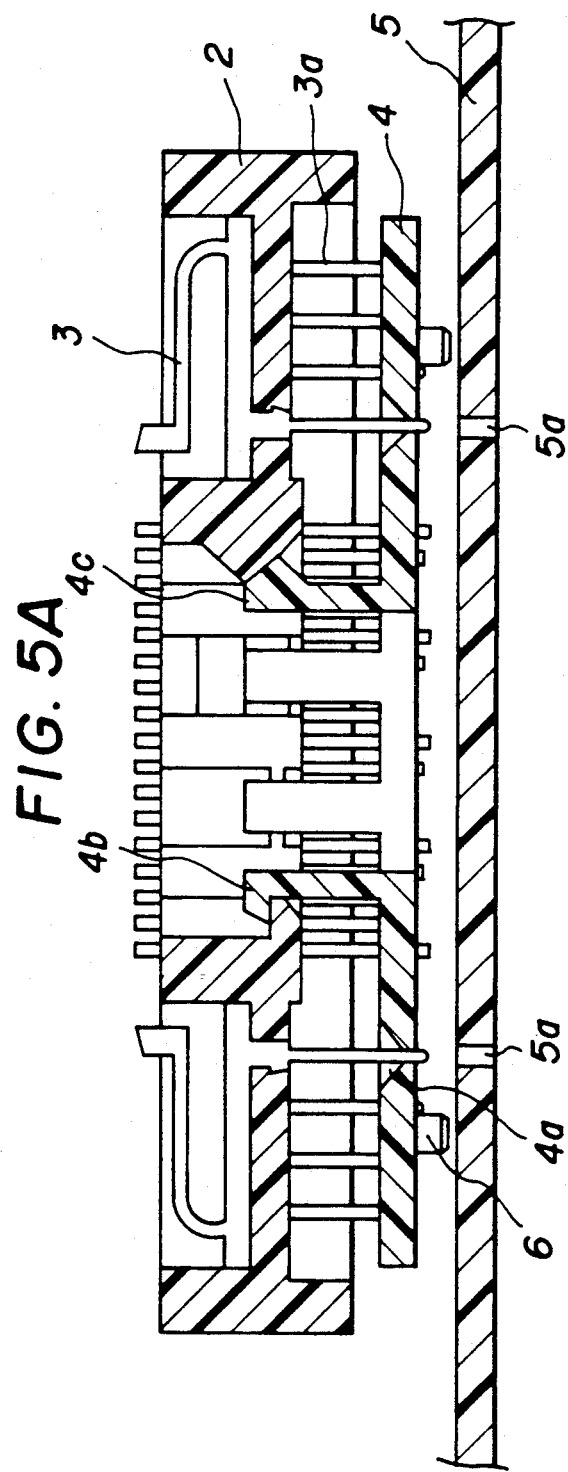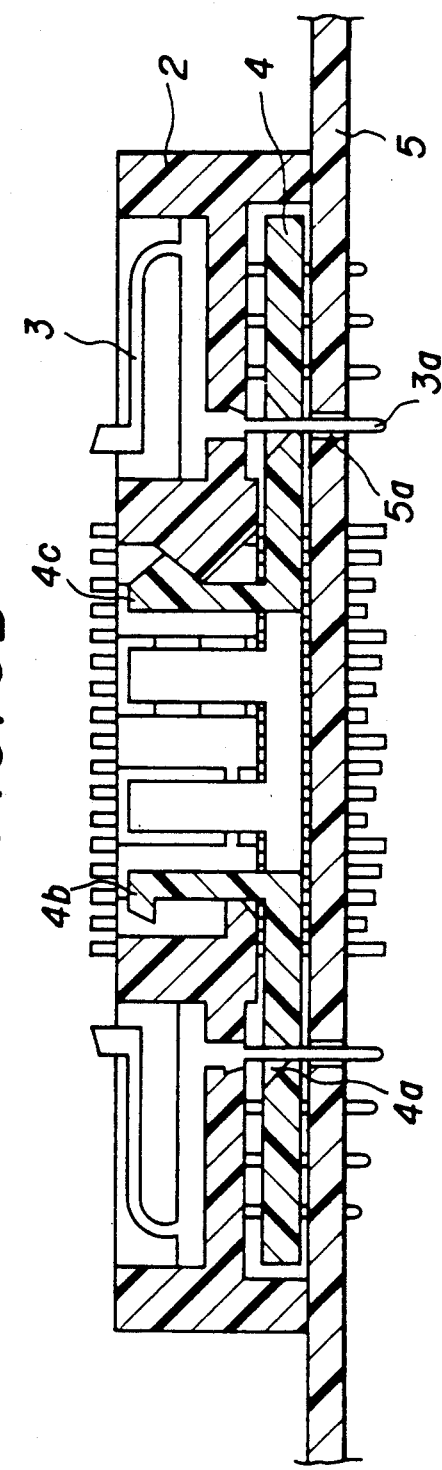

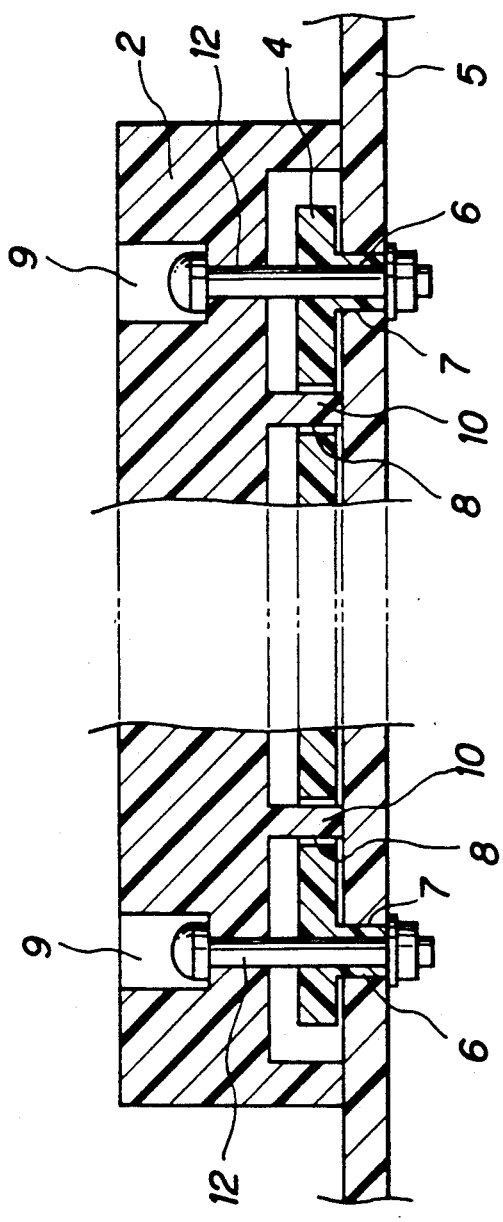

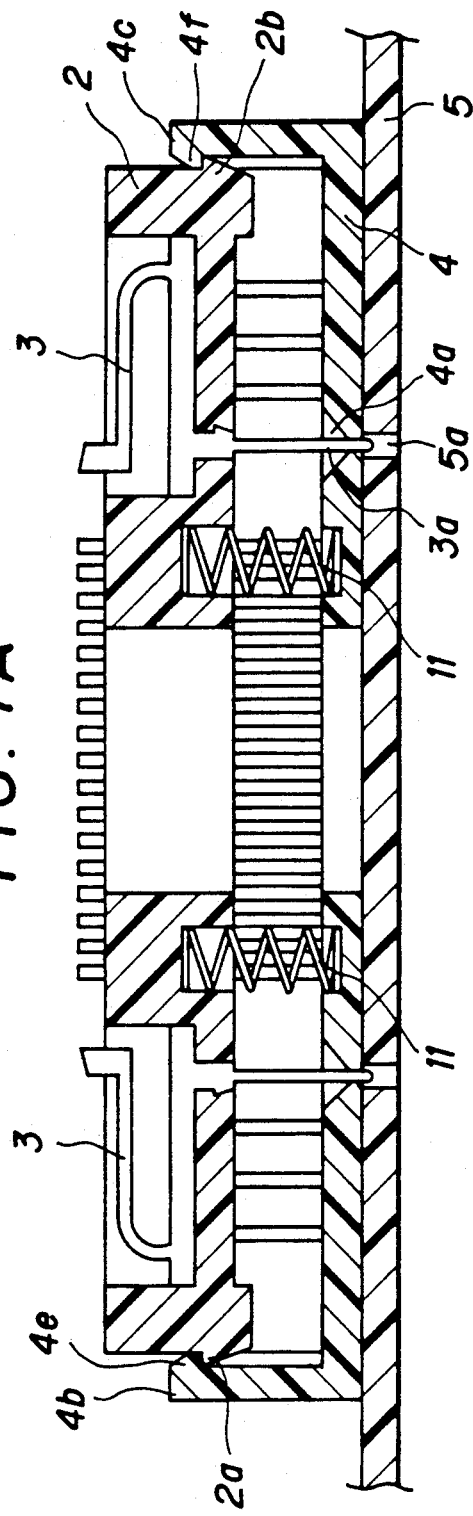
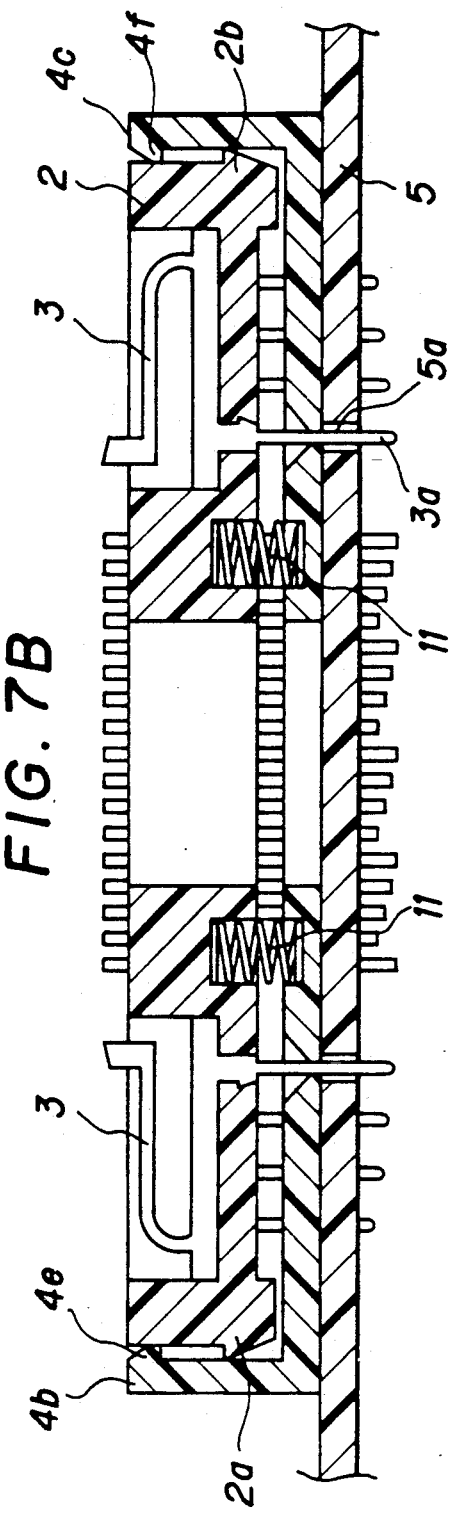
FIG. 7A
FIG. 7B

CONNECTOR FOR ELECTRIC PARTS

BACKGROUND OF THE INVENTION

1. Field of the Invention

This invention relates to a connector used for connecting with an electric part, and more particularly to a connector in which leg portions of contacts project outwardly, and the projection surface from which the leg portions project is provided with a locator through which the leg portions extend to locate the connector relative to the electric part.

2. Brief Description of the Prior Art

There is known a conventional connector in which the leg portions of contact extend through a locator and then through a wiring board. For example, a locator for a connector is disclosed in Japanese Utility Model Publication No. Sho 45-5567 in which the locator is provided with a tapered guide hole.

However, this prior art device has the following disadvantages. That is, when the connector for an electric part is placed on a printed circuit board, the printed circuit board and the connector for an electric part, or the connector and the locator must be held in a horizontal state. In this case, the locator tends to incline or escape from the leg portion because one side of the locator is displaced due to gravity. This naturally causes an incorrect positioning of the tip of the terminal and requires that the locator be returned to the position of the tip of the leg portion in order to perform the same work all over again.

Also, when the connector for an electric part is placed on the printed circuit board, the connection hole of the printed circuit board attains a dead angle relative to the connector body for an electric part and the locator. Therefore, it is very difficult to correctly align the guide hole of the locator and the connection hole of the printed circuit board with respect to each other while holding the printed circuit board and the connector for an electric part in their inclined states. Moreover, when the operator tries to confirm the connection hole of the printed circuit board by inclining the connector for an electric part, the locator readily becomes inclined and/or separated from the connector.

Furthermore, when the operator tries to confirm the positioning of the connection hole of the printed circuit board without inclining the connector for an electric part, it is necessary to locate the neighborhood of the connection hole of the printed circuit board by the tip of the leg portion of the connector for an electric part. Accordingly, there is always a possibility that the wiring of the printed circuit board will be scratched or cut off by mistake.

The present invention was accomplished in order to obviate the above-mentioned disadvantages.

SUMMARY OF THE INVENTION

It is therefore an object of the present invention to provide a connector for an electric part including means for temporarily fixing or resiliently holding a locator in order to facilitate a smooth and prompt mounting operation to a printed circuit board.

It is another object of the present invention to provide a connector for an electric part, in which the wiring of the printed circuit board is not scratched or cut off when the connector is being mounted on the printed circuit board.

In order to achieve the above-mentioned objects, a connector for an electric part of the present invention is designed such that a locator can be moved between a first position close to a connector board and a second position spaced apart from the connector board, and such that the locator can be temporarily fixed to or resiliently held in the second position spaced apart from the connector board.

According to the present invention, since the locator can be moved between a first position close to the connector board and a second position spaced apart from the connector board, and the locator can be temporarily fixed to or resiliently held in the second position spaced apart from the connector board, the tip portions of the leg portions can be effectively guided by the locator. This is very advantageous when the connector for an electric part is to be mounted on a printed circuit board.

Furthermore, according to one embodiment of the present invention, the locator is provided with a positioning pin such that the tips of the leg portions can be correctly positioned with respect to the printed circuit board in order to properly guide the insertion of the leg portions before the tips of the leg portions contact the printed circuit board. As a result, when the leg portions are inserted, the wiring of the printed circuit board is not scratched or cut off.

BRIEF DESCRIPTION OF THE DRAWINGS

The above and other objects, features and advantages of the present invention will become more manifest to those skilled in the art from the following detailed description of the invention with reference to the accompanying drawings, wherein:

FIGS. 4(A) and 4(B) are sectional views taken along line A—A of FIG. 1 with FIG. 4(A) being a view before mounting, and FIG. 4(B) being a view after mounting;

FIGS. 5(A) and 5(B) are sectional views taken along line A—A of FIG. 1 showing a connector for an electric part according to another embodiment of the present invention, with FIG. 5(A) being a view before mounting and FIG. 5(B) being a view after mounting;

FIG. 6 is a sectional view taken along line B—B of the above embodiment (after being mounted);

FIG. 7(A) and 7(B) are sectional views taken along line A—A of FIG. 1 showing a connector for a electric part according to still another embodiment of the present invention, with FIG. 7(A) being a view before mounting and FIG. 7(B) being a view after mounting.

DETAILED DESCRIPTION OF THE INVENTION

The embodiments of the present invention will now be described with reference to FIGS. 1 through 8.

Figure 1:
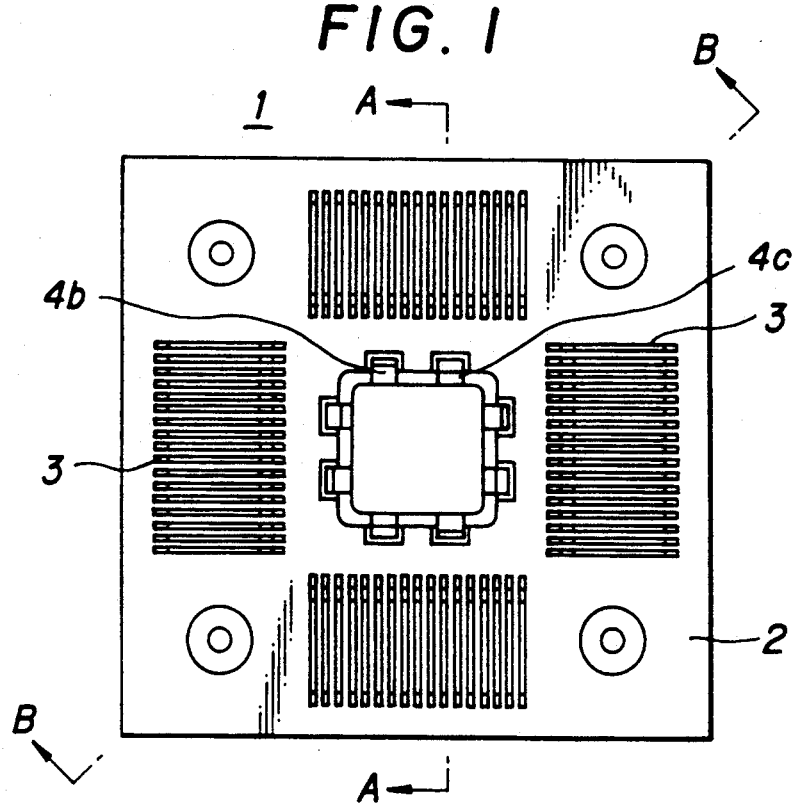
FIG. 1 is a plan view of a connector for an electric part according to one embodiment of the present invention.
Figure 2:
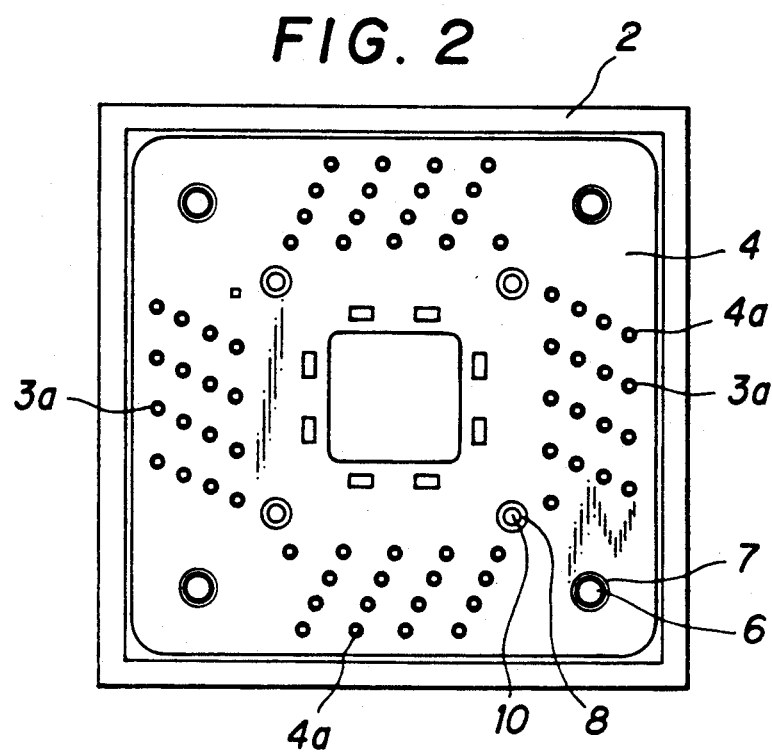
FIG. 2 is a bottom view thereof.

FIG. 1 shows a plan view of a connector 1 for an electric part, which has a plurality of contacts 3 arranged on a connector board 2 and adapted to contact with an electric part.

Each of the contacts 3 has a leg portion 3a which projects outward from the connector board 2 so as to be connected with a wiring board 5.

Figure 3:
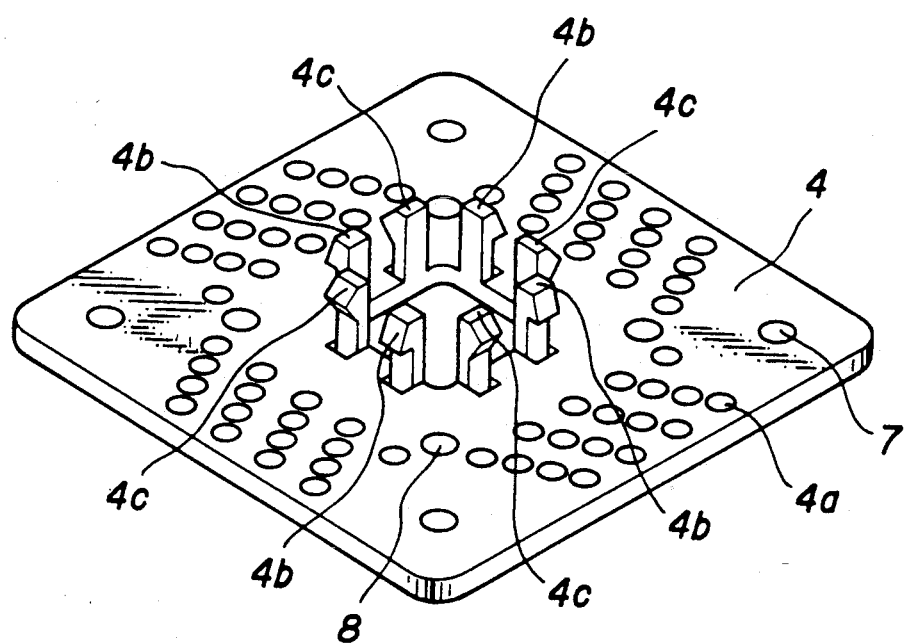
FIG. 3 is a perspective view of a locator of the connector for an electric part according to one embodiment of the present invention.

A projection surface of the connector board 2 from which the leg portions 3a project is provided with a locator 4 as shown in FIG. 3.

The locator 4 is provided with a plurality of tapered leg portion guide holes 4a adapted to receive the leg portions 3a and correctly position them. The locator 4 is further provided with temporary fixing means for temporarily fixing the locator 4 in a position away from the leg projection surface of the connector board 2. The temporary fixing means is provided with an engagement means disposed between the locator 4 and the connector board 2 and adapted to engage in a male and female engagement fashion at the position away from the connector board 2. The locator 4 is allowed to escape and to move when the engagement means exerts a compulsive moving force upon the locator 4 in the approaching direction. As one concrete example, locator 4 is provided at a generally central portion thereof with a plurality of depart stoppers 4b and approach stoppers 4c, all projecting therefrom. The depart stoppers 4b, as shown in FIG. 4(A), are engaged with the connector board 2 such that the locator 4 is permitted to move in the approaching direction and prohibited from moving in the departing direction. The approach stoppers 4c are abutted against the connector board 2 such that the locator 4 is restricted to move in the approaching direction, and to thereby keep the locator 4 spaced apart from the connector board 2 by a predetermined distance, and the tip portions of the leg portions 3a of the contacts 3 are shallowly inserted into the tapered guide holes 4a of the plate type of the locator 4 in order to correctly position the components in a temporary fixed state. In the foregoing state, the locator 4 is correctly positioned relative to the wiring board 5. As is shown in FIG. 4(B), when the connector board 2 is pushed toward the wiring board 5, the depart stoppers 4c are resiliently displaced in order to cancel the abutting engagement, thereby cancelling the temporary fixed state of the locator 4. As a result, the connector board 2 is permitted to move toward the wiring board 5 and the leg portions 3a of the connector 1 are inserted into the connection holes 5a of the wiring board 5. Thus, the connector 1 is correctly mounted on the wiring board 5.

The depart stoppers 4b prevent the movement in the departing direction in such a manner that engaging claws formed on the tips of the depart stoppers 4b are engaged with a retaining step portion 2a of the connector board 2. On the other hand, the approach stoppers 4c are brought into abutment with the connector board 2 while the depart stoppers 4b are in engagement with the connector board 2, such that by exerting a compulsive force on the connector board 2 in the direction opposite to the engaging direction, the connector board 2 is permitted to climb over the approach stoppers and move in the approaching direction toward the wiring board 5. For example, the projection 4f disposed at the tip of the approach stopper is abutted with the projection 2b formed on the connector board 2, and the projections 4f and 2b can be moved beyond one another to cancel the abutting engagement. As a result, the state of FIG. 4(B) can be obtained from that shown in FIG. 4(A) or the state of FIG. 4(A) can be obtained from that shown in FIG. 4(B). In the meantime, the locator 4 can be moved in the approaching and departing directions. The slip projections 4f and 2b are formed, for example, with hill shapes or arcuate shapes having tapered upper and lower surfaces.

As described in the foregoing, the locator 4 can be moved between a first position close to the connector board 2 and a second position away from the connector board 2. The locator 4 can be temporarily fixed in the second position away from the connector board 2 as shown in FIG. 4(A). On the other hand, when in the first position close to the connector board 2, the leg portions 3a are inserted into the connection holes 5a of the wiring board 5.

FIGS. 5 and 6 show another embodiment of the connector 1 for an electric part. In this embodiment, positioning pins 6 to be inserted into fixing screw holes 7 of the wiring board 5 are arranged on a projection surface of the locator 4 from which the leg portions 3a project. Each of the positioning pins 6 has a bore formed therethrough for insertions of the pins 6 through the locator 4. The locator 4 is provided in the vicinity of its central portion with a reinforcing projection escape hole 8. On the other hand, in a position corresponding to the fixing screw hole 6, a fixing screw insertion hole 9 is formed through the connector board 2. In a position corresponding to the reinforcing projection escape hole 8, the connector board 2 is provided with a reinforcing projection 10.

The positioning pin 6 is set such that when the locator 4 is temporarily fixed in the second position away from the connector board 2, the tip of the positioning pin 6 is in a position (distant position) spaced apart from the tip of the leg portion 3a. Accordingly, when the locator 4 is correctly positioned on the wiring board 5 by the positioning pins 6, the inserting work of the leg portion can be performed without having the tip of the leg portion 3a contact the wiring board 5.

Furthermore, as is shown in FIG. 6, after the connector 1 for an electric part is mounted on the wiring board 5, they may be fixed together by screws 12, etc. using the fixing screw hole 7 and the fixing screw inserting hole 9. In order to resist forces tending to deform the connector board 2 during connection of the board 2 to the wiring board 5 or during connection of the connector 1 for an electric part with another electric part, a reinforcing projection 10 contacts the wiring board 5 in the vicinity of its central portion through the escape hole 8 of the locator 4, so that the strength of the wiring board 5 can also be utilized to resist deformation of the connector board 2.

FIGS. 7(A) and 7(B) show still another embodiment of a connector 1 for an electric part according to the present invention. In this embodiment, instead of the approach stoppers, coil springs 11 are interposed between the locator 4 and the connector board 2, and the depart stoppers 4b are disposed in such a manner as to be able to engage with the outer peripheral portion of the connector board 2. That is, the locator 4 and the connector board 2 are biased apart by a biasing force of the coil springs 11, and the locator 4 is temporarily fixed in a position spaced from the connector board 2, such position being defined by the position at which the depart stoppers 4b engage with the locator 4 in a position spaced from the connector board 2 by a predetermined distance.

Figure 8A:
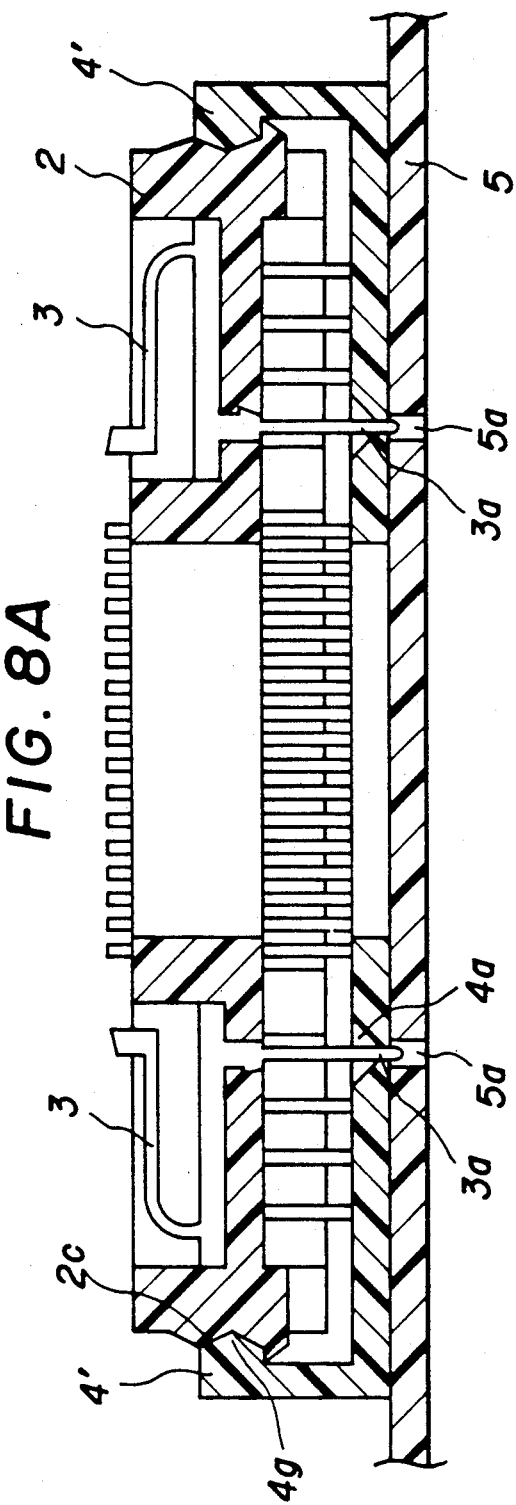
FIG. 8(A) and 8(B) are sectional views taken along line A—A of FIG. 1 showing a connector for an electric part according to yet another embodiment of the present invention, with FIG. 8(A) being a view before mounting and FIG. 8(B) being a view after mounting.
Figure 8B:
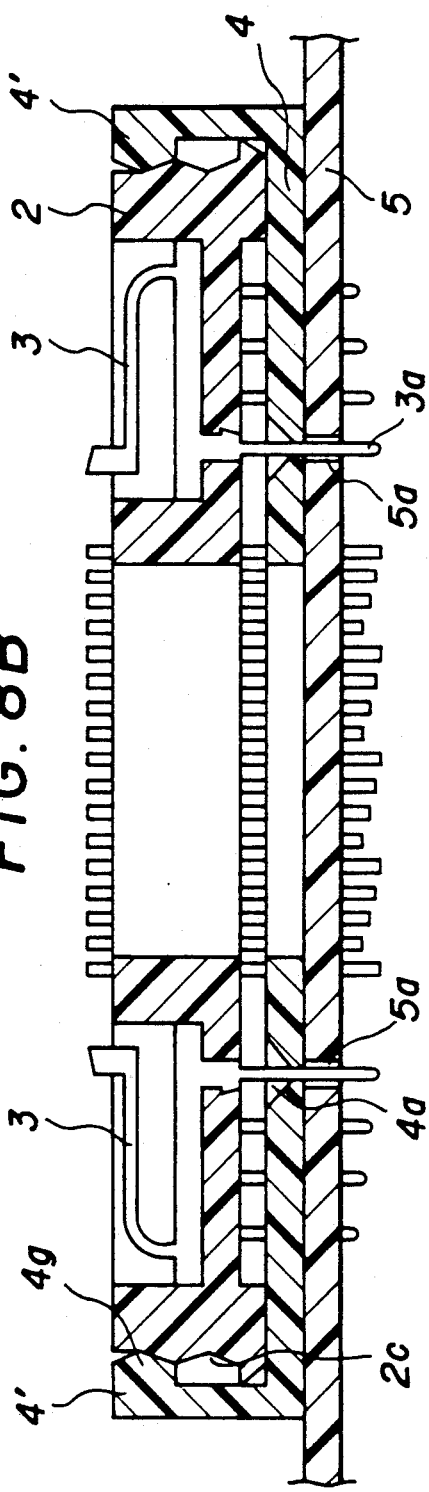

FIGS. 8(A) and 8(B) show yet another embodiment of a connector 1 for an electric part according to the present invention. In this embodiment, each of the depart stoppers 4b is formed as a single body with the approach stoppers 4c and are engageable with the outer peripheral portion of the connector 1 for an electric part.

That is, the locator 4 is provided with temporary fixing elements 4 at opposing ends of the locator 4, and each of the temporary fixing elements is provided with an engaging projection 4g. On the other hand, side surfaces of the ends of the connector board 2 are provided with recess portions 2c, respectively, for receiving the engaging projections 4g. As is shown in FIG. 8(A), when the engaging projections 4g are in engagement with the recess portions 2c, the second position of the locator 4 spaced apart from the connector board 2 is maintained, until the engaging projections 4g are forced beyond the engaging recess portions 2c to permit the locator 4 to move in the approaching direction.

When the locator 4 is temporarily fixed to or resiliently held in the second position away from the connector board 2, at least two leg portions 3a project from the leg portion guide holes 4a of the locator 4. Otherwise, the tips of the leg portions 3a are shallowly inserted in the leg portion guide holes 4a such that the tips do not project therefrom, or the tips of the leg portions 3a are held in positions immediately above the guide holes 4a. In the foregoing state, the locator 4 is temporarily fixed or resiliently held.

As described in the foregoing, according to the present invention, the tip portions of the leg portions can be reliably restricted by the locator temporarily fixed to or resiliently held in the position spaced apart from the connector board. Also, by holding the locator in its horizontal state by means of the aforementioned temporary fixing or resilient holding arrangement, the connector for an electric part can be quickly and properly mounted to the printed circuit board.

Also, by means of the positioning pins for correctly positioning the locator with respect to the wiring board, the mounting operation can be simplified, and scratching or cutting of the wiring of the printed circuit board is prevented during insertion of the contact leg portions.

Also, by making the position of the positioning pin for the locator and the position of the fixing screw for the connector for an electric part the same, the abovementioned improvement can be obtained without forming extra holes in the printed circuit board, and the degree of freedom of wiring patterns of the printed circuit board is also not reduced.

Although several preferred embodiments of the present invention have been described, the present invention is not limited to these embodiments. It goes without saying that many changes and modifications can be made without departing from the scope and the spirit of the appended claims.

What is claimed is:

1. A connector for an electric part, comprising
a connector board;
a plurality of contacts, each of which has a leg portion arranged to project from the connector board;
a locator having a plurality of positioning holes formed in a surface thereof through which said leg portions of said contacts are respectively adapted to project, said locator being movable between a first position close to said connector board and a second position spaced apart from said connector board;
temporary fixing means for temporarily maintaining said locator in said second position spaced apart from said connector board; and
a plurality of positioning pins mounted on said surface of said locator and adapted to correctly position said locator relative to a printed circuit board.

2. A connector as recited in claim 1, wherein
when said temporary fixing means maintains said locator in said second position, at least two of said leg portions extend through respective ones of said positioning holes.

3. A connector as recited in claim 1, wherein
wherein said temporary fixing means maintains said locator in said second position, said plurality of said leg portions do not extend through said positioning holes.

4. A connector as recited in claim 1, wherein
said positioning pins each have a bore formed therethrough; and
a plurality of fixing screws respectively extend through said bore of said positioning pins and are adapted to fix said connector board to the printed circuit board.

5. A connector as recited in claim 1, wherein
when said temporary fixing means maintains said locator in said second position, free ends of said positioning pins are located farther from said connector board than are free ends of said leg portions of said contacts.

6. A connector for an electric part, comprising
a connector board;
a plurality of contacts, each of which has a leg portion arranged to project from the connector board;
a locator having a plurality of positioning holes formed in a surface thereof through which said leg portions of said contacts are respectively adapted to project, said locator being movable between a first position close to said connector board and a second position spaced apart from said connector board;
holding means for resiliently holding said locator in said second position spaced apart from said connector board; and
a plurality of positioning pins mounted on said surface of said locator and adapted to correctly position said locator relative to a printed circuit board.

7. A connector as recited in claim 6, wherein
when said holding means holds said locator in said second position, at least two of said leg portions extend through respective ones of said positioning holes.

8. A connector as recited as per claim 7, wherein
when said temporary fixing means maintains said locator in said second position, said plurality of said leg portion do not extend through said positioning holes.

9. A connector as recited in claim 6, wherein
said positioning pins each have a bore formed therethrough; and
a plurality of fixing screws respectively extend through said bores of said positioning pins and are adapted to fix said connector board to the printed circuit board.

10. A connector as recited as per claim 7, wherein
when said temporary fixing means maintains said locator in said second position, free ends of said positioning pins are located farther from said connector board than are free ends of said leg portions of said contacts.

* * * * *